United States Patent [19]

Tokunaga et al.

[11] Patent Number: 5,425,808
[45] Date of Patent: Jun. 20, 1995

[54] PROCESS FOR SELECTIVE FORMATION OF III-IV GROUP COMPOUND FILM

[75] Inventors: Hiroyuki Tokunaga, Kawasaki; Takao Yonehara, Atsugi, both of Japan

[73] Assignee: Canon Kabushiki Kaisha, Tokyo, Japan

[21] Appl. No.: 143,247

[22] Filed: Oct. 29, 1993

Related U.S. Application Data

[63] Continuation of Ser. No. 921,979, Aug. 4, 1992, abandoned, which is a continuation of Ser. No. 638,019, Jan. 7, 1991, abandoned, which is a continuation of Ser. No. 174,512, Mar. 28, 1988, abandoned.

[30] Foreign Application Priority Data

Mar. 26, 1987 [JP] Japan ................................. 62-71989

[51] Int. Cl.$^6$ ............................................. C30B 25/04
[52] U.S. Cl. ..................................... 117/95; 117/90; 117/106; 117/934; 437/89; 437/90; 437/108
[58] Field of Search .................................. 156/610–614; 437/81, 83, 89, 90, 108, 110, 106, 107, 126, 129, 132, 133, 915, 949, 976; 427/252; 428/620, 621; 148/33, 33.2; 117/90, 95, 94, 106, 934

[56] References Cited

U.S. PATENT DOCUMENTS

| | | | |
|---|---|---|---|
| 3,620,833 | 11/1971 | Gleim et al. | 156/614 |
| 3,764,409 | 10/1973 | Nomura et al. | 437/90 |
| 3,885,061 | 5/1975 | Corboy et al. | 156/613 |
| 4,131,496 | 12/1978 | Weitzel et al. | 156/612 |
| 4,174,422 | 11/1979 | Mathews et al. | 156/610 |
| 4,216,037 | 8/1980 | Katoda et al. | 148/175 |
| 4,279,688 | 7/1981 | Abrahams et al. | 156/613 |
| 4,467,521 | 8/1984 | Spooner et al. | 156/612 |
| 4,470,192 | 9/1984 | Miller | 156/612 |
| 4,479,847 | 10/1984 | McCaldin et al. | 437/90 |
| 4,530,149 | 7/1985 | Jastrzebski et al. | 437/90 |
| 4,549,926 | 10/1985 | Corboy, Jr. et al. | 156/612 |
| 4,551,394 | 11/1985 | Betsch et al. | 437/90 |
| 4,587,717 | 5/1986 | Daniele et al. | 437/90 |
| 4,588,447 | 5/1986 | Golecki | 437/84 |
| 4,670,088 | 6/1987 | Tsaur et al. | 437/89 |
| 4,874,718 | 10/1989 | Inoue | 437/83 |

FOREIGN PATENT DOCUMENTS

| | | |
|---|---|---|
| 0244081 | 11/1987 | European Pat. Off. . |
| 58-199537 | 11/1983 | Japan . |
| 0028327 | 2/1984 | Japan ................................. 437/83 |

OTHER PUBLICATIONS

J. W. Matthews, Epitaxial Growth, Part A, published by Academic Pres, N.Y. 1975, pp. 12, 21, 413, 418.

Jastrzebski, "SOI BY CVD: Epitaxial Lateral Overgrowth (ELO) Process-Review", Journal of Crystal Growth 63 (1983) pp. 493-526.

Chem. et al., "Embedded Epitaxial Growth of . . . Lasers", Appl. Phys. Lett., 38(5), 1 Mar. 1981.

Choudhury et al., "Selective Growth of Epitaxial Silicon and Gallium Arsenide", J. Electrochem. Soc., "Solid State Science", vol. 118, No. 1, pp. 107–110 (1971).

*Primary Examiner*—Robert Kunemund
*Attorney, Agent, or Firm*—Fitzpatrick, Cella, Harper & Scinto

[57] ABSTRACT

A process for selective formation of a III-V group compound film comprises applying a compound film forming treatment, in a gas phase including a starting material for supplying the group III atoms of Periodic Table and a starting material for supplying the group V atoms of Periodic Table, on a substrate having a non-nucleation surface ($S_{NDS}$) with small nucleation density and a nucleation surface ($S_{NDL}$) with a larger nucleation density ($ND_L$) than the nucleation density ($ND_S$) of said non-nucleation surface ($S_{NDS}$) and a large area sufficient for a number of nuclei to be formed, and forming selectively a III-V group compound film only on said nucleation surface ($S_{NDL}$).

6 Claims, 6 Drawing Sheets

PRIOR ART

PRIOR ART

PROCESS FOR SELECTIVE FORMATION OF III-IV GROUP COMPOUND FILM

This application is a continuation of application Ser. No. 07/921,979, filed Aug. 4, 1992, now abandoned which in turn, is a continuation of application Ser. No. 07/638,019, filed Jan. 7, 1991, now abandoned; which in turn, is a continuation of application Ser. No. 07/174,512, filed Mar. 28, 1988, now abandoned.

BACKGROUND OF THE INVENTION

1. Field of the Invention

This invention relates to a process for selective formation of a deposited film, particularly to a selective formation process for forming a deposited film of a III-V group compound in a self-alignment fashion.

The selective formation process of a deposited film according to the present invention is applicable for example, to preparation of thin films to be used for semiconductor integrated circuits, optical integrated circuits, etc.

2. Related Background Art

FIGS. 1A-1E illustrate the steps of the process for forming a thin film by photolithography of the prior art.

Figure 1A:
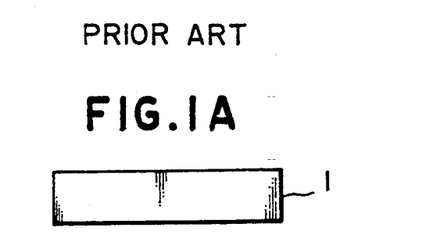
FIGS. 1A-1E illustrates the steps showing a thin film forming process according to photolithography of the prior art.
Figure 1B:
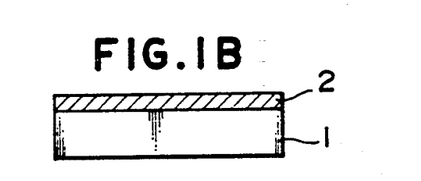
Figure 1C:
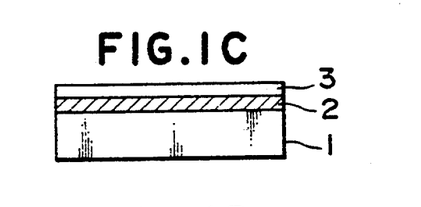

First, a substrate 1 comprising a material species with uniform composition as shown in FIG. 1A is washed, and then a thin film 2 is deposited on the whole surface of the substrate 1 according to various thin film depositing methods (vacuum vapor deposition method, sputtering method, plasma discharging method, MBE method, CVD method, etc.) (FIG. 1B).

Figure 1D:
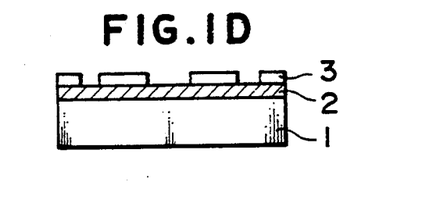

Subsequently, onto the thin film 2 there is applied a photoresist 3 (FIG. 1C), and the photoresist 3 is exposed to light by use of a photomask of a desired pattern and the photoresist 3 is removed partially by development (FIG. 1D).

Figure 1E:
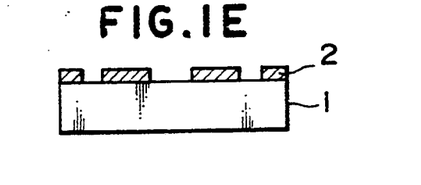

With the remaining photoresist 3 as the mask, the thin film 2 is etched to form a thin film 2 with a desired pattern (FIG. 1E).

By repeating such photolithographic steps, thin films of desired patterns are laminated to constitute an integrated circuit. In that case, alignment between the thin films of the respective layers becomes an extremely important factor for the characteristics of the device. Particularly, in the case of ultra-LSI where precision at the submicron level is is demanded, precision of the shape of thin films of the respective layers is also extremely important along with their alignment.

However, in the above process for forming a thin film of the prior art, it is difficult to effect necessary alignment of the photomasks with good precision, and also the precision of shape is insufficient, because thin films of desired patterns are formed by etching.

FIGS. 2A-2D illustrate the steps of the process for forming a thin film by use of lift-off method of the prior art.

Figure 2A:
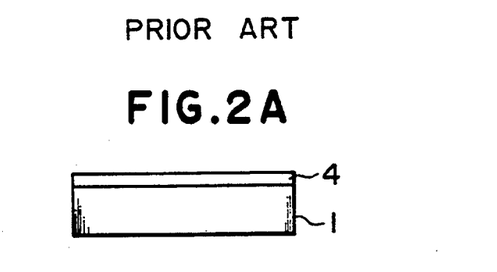
FIGS. 2A-2D illustrates the steps showing a thin film forming process by use of lift-off of the prior art.
Figure 2B:
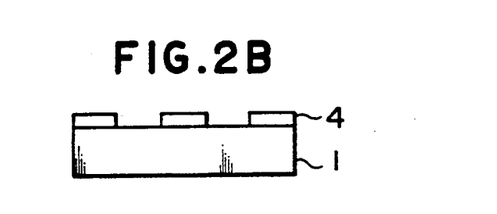
Figure 2C:
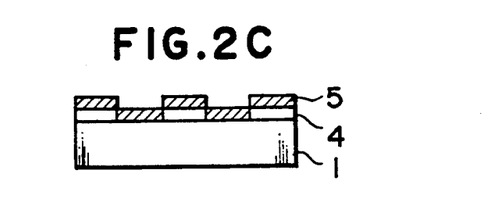
Figure 2D:
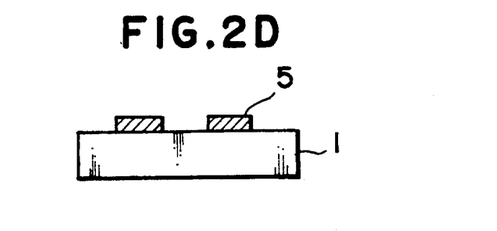

First, a photoresist 4 is applied on a substrate 1 (FIG. 2A), and the photoresist 4 with a desired pattern is removed by photolithography (FIG. 2B).

Subsequently, a thin film 5 is deposited according to a thin film deposition method (FIG. 2C), and the remaining photoresist 4 is dissolved away. By this operation, the thin film on the remaining photoresist 4 is removed at the same time, whereby a thin film 5 with a desired pattern is formed. By repeating the above steps, an integrated circuit is constituted.

However, in such a thin film forming process, because a thin film is formed on a photoresist, it is required that the deposition of a thin film be performed at a temperature not higher than the resistant temperature of the photoresist, therefore, the deposition method is greatly restricted. Also, in removing the photoresist, the shape of the remaining thin film is influenced thereby and therefore precision of the shape becomes insufficient. Also, there is also the problem that it is highly probable that the side wall or the inner portion of the think film may be contaminated with carbon, a component of the photoresist.

Also, selective deposition methods, are known in which a monocrystal substrate is covered partially with an amorphous thin film, and the same material as the substrate material is epitaxially grown selectively only at the exposed portion of the monocrystal substrate. For example, there is the selective epitaxial Growth (SEG) method in which a silicon monocrystal substrate is partially covered with silicon oxide to effect selective Growth of silicon (B. D. Joyce & J. A. Baldrey, Nature vol. 195,485, 1962), and the method in which a GaAs substrate is covered partially with an amorphous thin film such as $SiO_2$, $Si_3N_4$, etc. to effect selectively epitaxial Growth of GaAs (P. Rai-Choudhury & D. K. Schroder, J. Electrochem. Soc., 118, 107, 1971), etc.

However, because these selective deposition methods rely on growing selectively the monocrystal semiconductor of the same kind from the exposed surface of a monocrystal substrate, they are limited in that the deposition surface for the base must also be monocrystalline, and therefore not applicable to polycrystalline substrates, amorphous insulating substrates.

Thus, the deposited film forming methods of the prior art are limited in the number of available substrates, and further, problems in shape of the pattern, and dimensional precision of the deposited film once formed.

SUMMARY OF THE INVENTION

An object of the present invention is to solve such problems of the prior art and to provide a process for forming a III-V group compound film with any desired shape in a self-alignment fashion at any desired portion of a substrate, irrespective of crystallinity of the base substrate.

According to the present invention, there is provided a process for forming a III-V group compound film comprising applying a compound film forming treatment, in a Gas phase including a starting material for supplying the group III atoms of the periodic table and a starting material for supplying the Group V atoms of the periodic table, on a substrate having a non-nucleation surface ($S_{NDS}$) with small nucleation density and a nucleation surface ($S_{NDL}$) with larger nucleation density ($ND_L$) than the nucleation density ($ND_S$) of said non-nucleation surface ($S_{NDS}$) and a large area sufficient for a number of nuclei to be formed, and forming selectively a III-V group compound film only on said nucleation surface ($S_{NDL}$).

DETAILED DESCRIPTION OF THE PREFERRED EMBODIMENTS

The III-V group compounds to be used in the present invention are not limited to 2-element compounds, but also include multi-element III-V group mixed crystal compounds of 3 elements or more.

Generally, the deposited film formation process is considered as follows.

When the substrate having a deposition surface is a material different in kind from the vaporized atoms, particularly an amorphous material, the vaporized atoms will be freely diffused on the substrate surface, or revaporized. And, as the result of collision mutually between the atoms, a nucleus is formed, and when the nucleus reaches the size rc where the change ΔG in its free energy G becomes the maximum. (stable nucleus) or more, ΔG is reduced and the nucleus continues to grow stably three-dimensionally and become shaped in an island.

The change ΔG in free energy G created by formation of nucleus is represented as follows:

$$G = 4\pi f(\theta_o r^2 + \tfrac{1}{3} \cdot gv \cdot r^3)$$

$$F(\theta) = \tfrac{1}{4}(2 - 3\cos\theta + \cos^2\theta)$$

where R: radius of curvature of nucleus
θ: contact angle of nucleus
gv: free energy per unit volume
$\delta_o$: surface energy between nucleus and vacuum.

Figure 3:
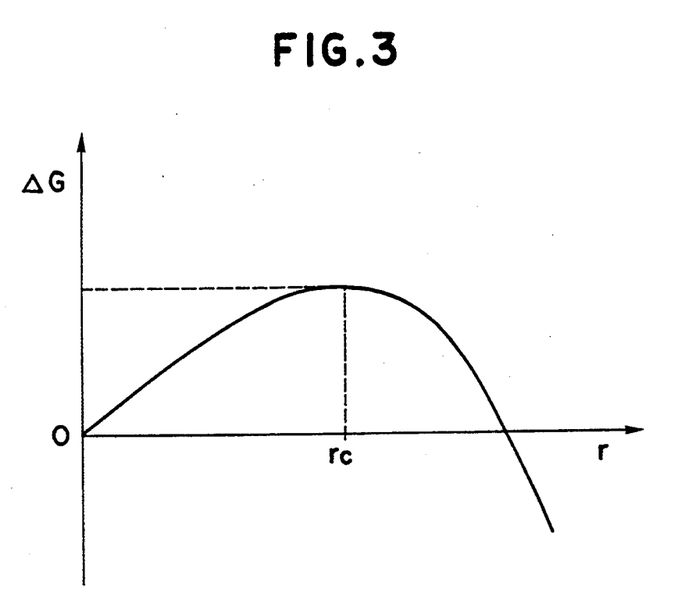
FIG. 3 is a line diagram showing the relationship between the change ΔG in free energy G and the radius of nucleus.

The manner in which ΔG is changed is shown in FIG. 3. In FIG. 3, the radius of curvature of the stable nucleus when ΔG is at the maximum value is Thus, the nucleus grows to become shaped in an island, and further grows until contact mutually between islands proceeds to cover the substrate surface in shape of a network, finally covering completely the substrate surface as a continuous film. Through such process, a thin film is deposited on the substrate.

In the deposition process as described above, the density of the nucleus formed per unit area of the substrate surface depends greatly on the interaction between the vaporized atoms and the substrate, and is also greatly influenced by the deposition conditions, typically the temperature.

Accordingly, by selecting appropriately the kinds of the material for the deposited film and the substrate material, and setting appropriately the deposition conditions such as temperatures, pressure, gas species, etc., the nucleation density (or nucleation speed) can be determined. Therefore, when one kind of material to be deposited is used and deposit on a deposition surface comprising two or more kinds of surfaces differing greatly in the above nucleation density, the deposited film can be formed selectively depending on the difference of nucleation density. For example, it is formed selectively as described below.

FIGS. 4A–4D illustrate schematically the process of forming a deposited film according to the present invention.

Figure 4A:
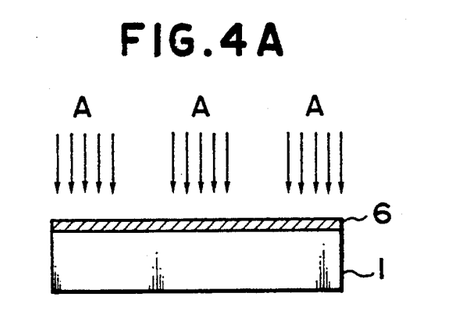
FIGS. 4A–4D illustrates schematically the process for selective formation of a deposited film according to the present invention.

First, the two kinds of materials constituting the deposition surface are called A and B, and the material to be deposited C, and the above materials A, B and C are selected so that the nucleation density of the material to be deposited C for the materials A and B may differ greatly, under certain deposition conditions. Here, it is supposed that the nucleation density for the material A is sufficiently great, and the nucleation density for the material B is negligibly small.

In FIG. 4A, on a substrate 1 of a material resistant to high temperatures such as high-melting glass, quartz, alumina, ceramics, etc., a thin film 6 of the material B is deposited according to a thin film forming method, and ions of the material A are implanted thereon with a desired pattern by use of the converging ion beam implantation technique.

Figure 4B:
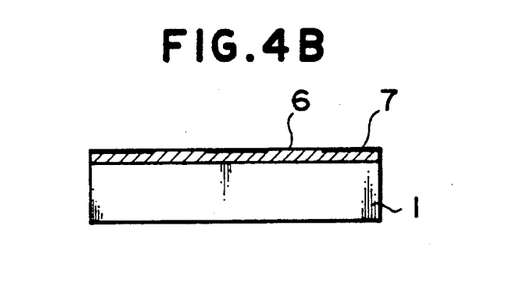

By this process, as shown in FIG. 4B, a region 7 of the material A is formed with a desired pattern so as to have a large area sufficient for a number of nuclei foe crystal growth to be generated on the thin film 6 of the material B.

Figure 4C:
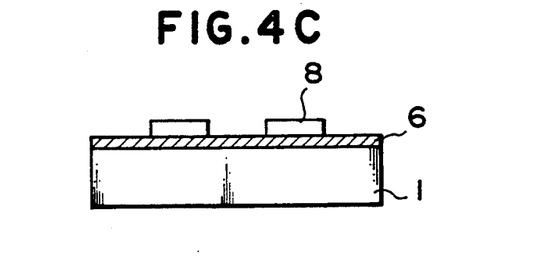

Thus, as the method for forming the region 7 constituted of the material A with a desired pattern on the deposition surface, as shown in FIG. 4C, a mask 8 may be formed with a desired pattern on the material B, and ions of the material A injected on the whole surface to provide the region 7, thereby forming a deposition surface as shown in FIG. 4B.

Also, a thin film of the material A may be formed on the material B, and the thin film of the material A may be formed to a desired pattern by photolithography.

As shown in FIG. 4B, on the deposition surface constituted of the material A and the material B to a desired pattern, the material C is deposited under predetermined conditions. At this time, no material C is deposited on the thin film 6 of the material B.

This may be considered to be due to revaporization of the vaporized atoms of the material C before becoming stable nucleus, or due to formation of a substance with high vapor pressure through the reaction of C atoms with the material B, whereby the material B is etched.

Figure 4D:
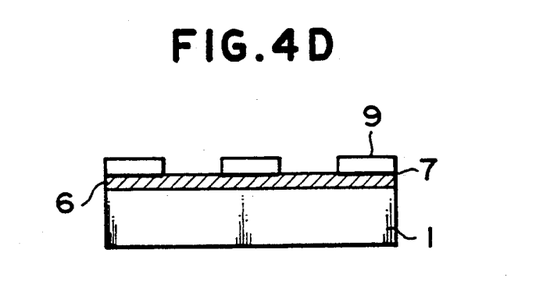

Thus, only on the region Y of the material A, the material C is deposited, and consequently a deposited film 9 with same pattern as the pattern of the region Y of the material A can be formed in a self-alignment fashion.

The present invention is described in more detail below by referring to Examples along with the drawings.

EXAMPLE 1

Referring to FIGS. 5A–5E, the process for forming selectively a GaAs film is described as a first example of the present invention.

Figure 5A:
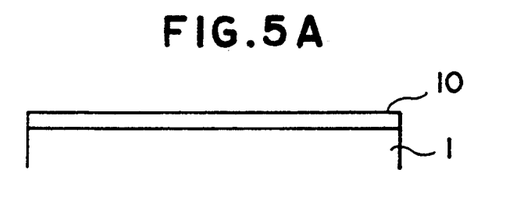
FIGS. 5A–5E illustrates the steps showing an example of selective formation of a GaAs film.

First, on a substrate 1 resistant to high temperature comprising ceramics, a $SiO_2$ film 10 was deposited to about 1000 Å by conventional CVD (chemical vapor deposition) by use of silane ($SiH_4$) and oxygen ($O_2$) [FIG. 5A]. The nucleation density (NDs) of GaAs on $SiO_2$ film is small, and the $SiO_2$ film 10 becomes the non-nucleation surface ($S_{NDS}$).

Figure 5B:
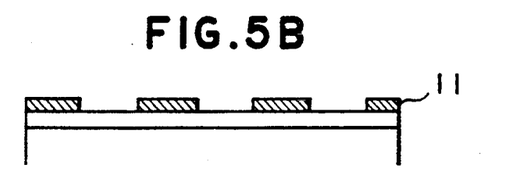
Figure 5C:
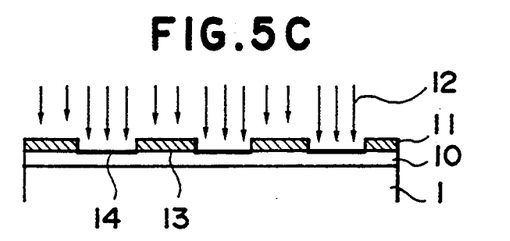

Next, the surface of the $SiO_2$ film 10 was masked with a photoresist 11 to a desired pattern [FIG. 5B].

By use of an ion implanter, As ions 12 were implanted in an amount of $2.5 \times 10^{16}/cm^2$. The As ions were implanted only on the surface exposed [FIG. 5C]. At the $SiO_2$ film surface 13 where no As ion is implanted, the nucleation density (NDs) of GaAs is small, and this portion becomes the non-nucleation surface ($S_{NDS}$) as mentioned above. On the other hand, the region 14 where As ions are implanted has larger nucleation density ($ND_L$) than the non-nucleation surface ($S_{NDS}$), which portion becomes the nucleation surfaces ($S_{NDL}$). The size of the region 7 was made 1 mm×1 mm square.

Figure 5D:
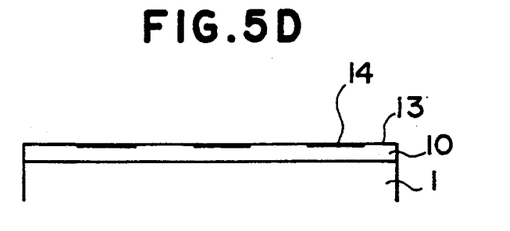

After the photoresist 11 was peeled off, the substrate 1 was subjected to heat treatment in a $H_2$ atmosphere at about 900° C. for about 10 minutes to clean the surface [FIG. 5D].

Figure 5E:
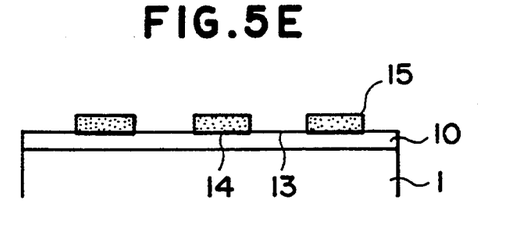

Subsequently, while the substrate 1 was heated to 600° C., trimethyl gallium (TMG) and arsine ($ASH_3$) at a molar ratio of 1:60 were flowed together with a carrier gas $H_2$ onto the substrate surface to grow a GaAs film according to the MOGVD (organometallic chemical vapor deposition) method. The reaction pressure was made 20 Torr. As shown in FIG. 5E, GaAs film 15 was formed only on the nucleation surface ($S_{NDL}$) 14 formed by implantation of As ions, and no GaAs film was formed on the non-nucleation surface ($S_{NDS}$), namely the $SiO_2$ film surface where no As was implanted.

Accordingly, as understood from the above example, by implanting As ions with a desired pattern, a GaAs film with any desired shape and dimension can be selectively formed.

EXAMPLE 2

FIGS. 6A–6E are drawings for illustration of the film formation steps of another example of the present invention.

Figure 6A:
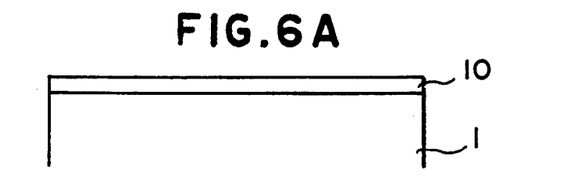
FIGS. 6A–6E illustrates the steps showing another example of selective formation of a GaAs film.
Figure 6B:
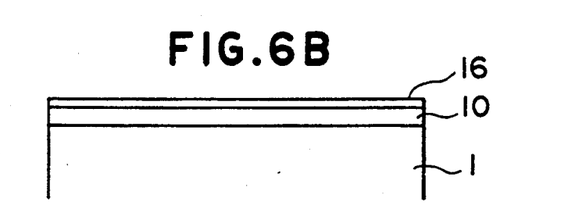

First, similarly as in Example 1, on the surface of a substrate 1 resistant to high temperature comprising alumina, a $SiO_2$ film 10 was deposited to about 1000 Å according to the CVD method by use of $SiH_4$ and $O_2$ [FIG. 6A].

Next, by means of an arc discharge type ion plating device, on the $SiO_2$ film 10 was formed an $Al_2O_3$ film. After the device was internally evacuated to $10^{-5}$ Torr, $O_2$ gas was introduced to $3\times 10^{-4}$ Torr, and an $Al_2O_3$ film 16 was deposited to about 300 Å on a substrate heated to 400° C. at an ionization voltage of 50 V, a substrate potential of $-50$ V and an output of 500 W [FIG. 6B].

Figure 6C:
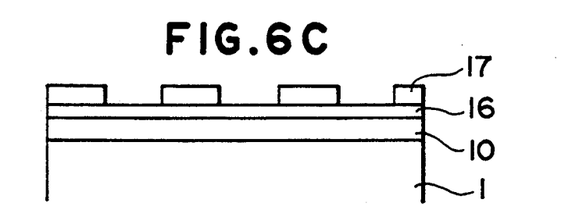

With a photoresist 17 masked to a desired pattern on the $Al_2O_3$ film 16, the portion of the $Al_2O_3$ film exposed was etched with an etchant of $H_3PO_4:HNO_3:CH_3COOH:H_2O=16:1:2:1$ [FIG. 6C]. At this time, the substrate was heated to about 40° C.

Figure 6D:
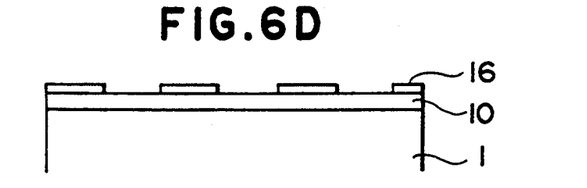

After the photoresist 17 was peeled off, the substrate 1 was subjected to heat treatment in a $H_2$ atmosphere at about 900° C. for about 10 minutes to clean the surface [FIG. 6D]. On the surface of $SiO_2$ film 10, nucleation density (NDs) of GaAs is small, which portion becomes the non-nucleation surface ($S_{NDS}$). On the other hand, the surface of $Al_2O_3$ film 16 has larger nucleation density ($ND_L$) than the non-nucleation surface ($S_{NDS}$) 10, which portion becomes the nucleation surface ($S_{NDL}$) 16. The size of the remaining $Al_2O_3$ film 16 was made 1 cm×1 cm square.

Figure 6E:
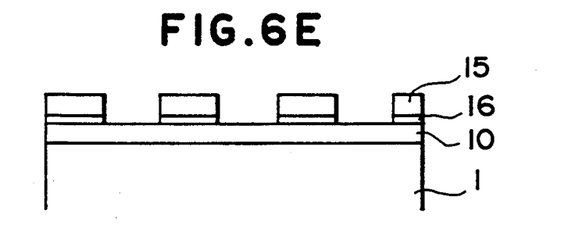

Subsequently, while the substrate 1 was heated to 600° C., trimethyl gallium (TMG) and arsine ($AsH_3$) at a molar ratio of 1:60 were flowed together with a carrier gas $H_2$ onto the substrate surface to grow a GaAs film according to the MOCVD (organometallic chemical vapor deposition) method. The reaction pressure was made 20 Torr. As shown in FIG. 6E, GaAs film 15 was formed only on the $Al_2O_3$ nucleation surface ($S_{NDL}$) 16, and no GaAs film was formed on the non-nucleation surface ($S_{NDS}$) 10, namely the $SiO_2$ film surface.

Thus, also according to the process of this Example, a GaAs film of any desired shape and dimension can be formed selectively. The conditions of temperature and pressure may be broadened similarly as described in Example 1.

EXAMPLE 3

A GaAlAs mixed crystal III–V group compound film was selectively formed in the following manner.

After deposition of $SiO_2$ film to about 1000 Å on the ceramic substrate 1 according to the CVD method by use of $SiH_4$ and $O_2$ in the same manner as in Example 1, with a photoresist masked to a desired pattern on the surface, As ions were implanted into the exposed $SiO_2$ film in an amount of $2.5\times 10^{16}/cm^2$ by use of an ion implanter.

Next, the resist film was peeled off, and the substrate was subjected to heat treatment in a $H_2$ atmosphere at about 900° C. for about 10 minutes to clean the surface.

Also for the GaAlAs mixed crystal, the $SiO_2$ portion implanted with no As ion has smaller nucleation density (NDs) to become the non-nucleation surface ($S_{NDS}$). On the other hand, the portion implanted with As ions has larger nucleation density ($ND_L$) to become the nucleation surface ($S_{NDL}$).

Onto the substrate having a surface where the nucleation surface ($S_{NDL}$) and the non-nucleation surface ($S_{NDS}$) thus having a nucleation density difference ($\Delta ND$) were formed, by use of $H_2$ as the carrier gas, TMG, trimethylaluminum (TMAl) and $AsH_3$ were flowed at a ratio of (TMG+TMAl):$AsH_3$ of 1:15 (molar ratio). The substrate temperature was made 800° C. by heating, and the reaction pressure was made 20 Torr. Similarly as shown in FIG. 5E, only on the nucleation surface ($S_{NDL}$) formed by implantation of As ions, the ternary mixed crystal III–V group compound GaAlAs film was formed selectively. The size of the nucleation surface ($S_{NDL}$) was made 1 cm×1 cm square.

The ratio of Ga and As in GaAlAs can be freely controlled by varying the ratio of the reactive gases TMG and TMAl.

As shown above in Examples, according to the present invention, a nucleation surface ($S_{NDL}$) having large nucleation density ($ND_L$) can be formed to a desired pattern, and a III–V group compound semiconductor film following the pattern can be formed.

In the above Examples, there are shown examples in which $SiO_2$ film is formed by the CVD method, but $SiO_2$ can be also formed according to the sputtering method. Further, quartz itself with its surface well flattened can be also used as the deposition surface.

The ion species to be implanted for formation of the nucleation surface ($S_{NDL}$) is not limited to As ion, but ions of the group III elements, ions of the group V elements, and further ions of the group II elements and ions of the group VI elements can be also used.

As the III–V compound, InP film can be selectively formed on an amorphous substrate by use of trimethyl indium $In(CH_3)_3$ and phosphine $PH_3$ as the reactive gases, and AlSb film by use of trimethylaluminum $Al(CH_3)_3$ and stibine $SbH_3$. According to combinations of the reactive gases as described above, films of GaP, GaSb, InAs, InSb, AlAs, AlP can be selectively grown, and further mixed crystal III–V group compound films according to any desired combination can be selectively grown.

Also, the reactive gas of the group III element is not limited to compounds having methyl groups as described above, but compounds having ethyl groups, propyl groups, butyl groups, isobutyl groups such as triethylgallium $Ga(C_2H_5)_3$, Tripropyl indium $In(C_3H_7)_3$, tributyl gallium $Ga(C_4H_9)_3$, triisobutylaluminum $Ai(CH_3)_2CHCH_2$, etc. can be also used.

The mixed crystal compound semiconductor can be selectively grown on the $Al_2O_3$ provided on $SiO_2$ similarly as in Example 2 as the nucleation surface ($S_{NDL}$), as a matter of course.

Further, in the respective Examples as described above, there are shown examples in which the MOCVD method is used in the step of selective growth of GaAs and GaAlAs films, but selective growth of the III–V group compound film can be performed also according to the same principle by use of the MBE (molecular beam epitaxy) method, etc.

As described in detail above, the process for selective formation of a III–V group compound film can form self-matchingly a deposited film of a desired pattern by utilizing the nucleation density difference (AND) depending on the kinds of the III–V group compound deposition surface materials, and therefore a deposited film with a desired pattern can be formed at high precision, which is advantageous particularly in constituting a highly integrated circuit. Further, the materials of the deposition surface are not required to be limited to only monocrystal but a III–V group compound deposited film can be formed at high precision also on an amorphous insulating material by selecting the material ($M_L$) for forming nucleation surface and the material ($M_S$) for forming non-nucleation surface having nucleation density difference.

Particularly, in the case of a compound semiconductor with large influence by chemical etching, a pattern can be formed without etching of the film itself, and therefore it becomes possible to maintain chemical stability of the film prepared at high level.

We claim:

1. A process for selective formation of a multi-component mixed crystal III–V group compound film of at least a ternary system on a substrate having a non-nucleation surface ($S_{NDS}$) with a small nucleation density and a nucleation surface ($S_{NDL}$) with a larger nucleation density which comprises:
   (a) ion implanting a pattern of non-monocrystalline nucleation surface ($S_{NDL}$) sites onto a portion of said non-nucleation surface ($S_{NDL}$), each of said non-monocrystalline nucleation surface ($S_{NDL}$) sites having (i) a larger nucleation density ($ND_L$) than the nucleation density ($ND_S$) of said non-nucleation surface ($S_{NDS}$) and (ii) a large area sufficient for a number of nuclei to be formed, said non-monocrystalline nucleation surface comprising a layer region containing an element of Group III or Group V of the Periodic Table;
   (b) applying to said substrate a compound film forming treatment in a gas phase including at least one starting material for supplying the Group III atoms and at least one starting material for supplying the Group V atoms to generate said number of nuclei; and
   (c) growing said mixed crystal III–V group compound film of at least a ternary system from said number of nuclei on said pattern of said non-monocrystalline nucleation surface sites.

2. A process for selective formation of a III–V group compound film according to claim 1, wherein said III–V group compound film is a binary system III–V group compound film.

3. A process for selective formation of a III–V group compound film according to claim 1, wherein said non-nucleation surface is comprised of an amorphous insulating material.

4. A process for selective formation of a III–V group compound film according to claim 3, wherein said amorphous insulating material is $SiO_2$.

5. A process for selective formation of a III–V group compound film according to claim 3, wherein said non-nucleation surface and said nucleation surface are constituted of $SiO_2$ and $Al_2O_3$, respectively.

6. A process for selective formation of a III–V group compound film according to claim 1, wherein said compound film forming treatment is the MOCVD method.

* * * * *

UNITED STATES PATENT AND TRADEMARK OFFICE
CERTIFICATE OF CORRECTION

PATENT NO. : 5,425,808

DATED : June 20, 1995

INVENTOR : HIROYUKI TOKUNAGA, ET AL.

It is certified that errors appear in the above-identified patent and that said Letters Patent is hereby corrected as shown below:

[54] Title

"III-IV GROUP" should read --III-V GROUP--.

[56] References Cited

Foreign Patent Documents, "0028327  2/1984  Japan" should read --59-28327  2/1984  Japan--.

COLUMN 1

Line 3, "III-IV GROUP" should read --III-V GROUP--;

Line 47, "is" (second occurrence) should be deleted.

COLUMN 2

Line 11, "think" should read --thin--;

Line 18, "Growth" should read --growth--;

Line 22, "1962)," should read --1962)--;

Line 25, "Growth" should read --growth--;

UNITED STATES PATENT AND TRADEMARK OFFICE
CERTIFICATE OF CORRECTION

PATENT NO. : 5,425,808

DATED : June 20, 1995

INVENTOR : HIROYUKI TOKUNAGA, ET AL.

It is certified that errors appear in the above-identified patent and that said Letters Patent is hereby corrected as shown below:

COLUMN 2, Cont'd.

Line 34, "strates," should read --strates, or--;

Line 37, "further," should read --further, involve--;

Line 50, "Gas" should read --gas--;

Line 52, "Group" should read --group--; and

Line 68, "art," should read --art.--.

COLUMN 3

Line 3, "nucleus," should read --nucleus.--;

Line 34, "$G=4\pi f(\theta_0 r^2 + 1/3 \cdot gv \cdot r^3)$" should read --$G=4\pi f(\theta)(\sigma_0 r^2 + 1/3 \cdot gv \cdot r^3)$--;

Line 38, "R:" should read --r:--;

Line 44, "is" should read --is rc.--; and

Line 60, "temperatures," should read --temperature,--.

COLUMN 4

Line 22, "foe" should read --for--; and

Line 47, "Y" should read --7--.

UNITED STATES PATENT AND TRADEMARK OFFICE
CERTIFICATE OF CORRECTION

PATENT NO. : 5,425,808

DATED : June 20, 1995

INVENTOR : HIROYUKI TOKUNAGA, ET AL.

It is certified that errors appear in the above-identified patent and that said Letters Patent is hereby corrected as shown below:

COLUMN 5

Line 11, "$H_2$atmosphere" should read --$H_2$ atmosphere--; and

Line 54, "$H_2$atmosphere" should read --$H_2$ atmosphere--.

COLUMN 6

Line 24, "$H_2$atmosphere" should read --$H_2$ atmosphere--.

COLUMN 7

Line 6, "gas-of" should read --gas of--;

Line 14, "$SiO_2$simi-" should read --$SiO_2$ simi- --; and

Line 27, "(AND)" should read --($\Delta$ND)--.

COLUMN 8

Line 9, "($S_{NDL}$)," should read --($S_{NDS}$),--; and

UNITED STATES PATENT AND TRADEMARK OFFICE
CERTIFICATE OF CORRECTION

PATENT NO. : 5,425,808

DATED : June 20, 1995

INVENTOR : HIROYUKI TOKUNAGA, ET AL.

It is certified that errors appear in the above-identified patent and that said Letters Patent is hereby corrected as shown below:

<u>COLUMN 8, Cont'd.</u>

Line 40, "claim 3," should read --claim 1,--.

Signed and Sealed this

Second Day of January, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,425,808
DATED : June 20, 1995
INVENTOR(S) : Tokunaga et al.

It is certified that error appears in the above-indentified patent and that said Letters Patent is hereby corrected as shown below:

On the title page, insert item [56] References Cited:

"continuation of Serial No. 638,019" should read --division of Serial No. 638,019--.

Signed and Sealed this

Twenty-fourth Day of September, 1996

Attest:

BRUCE LEHMAN

Attesting Officer        Commissioner of Patents and Trademarks